US008659300B2

(12) United States Patent
Finch et al.

(10) Patent No.: US 8,659,300 B2
(45) Date of Patent: Feb. 25, 2014

(54) STRESS TESTING OF SILICON-ON-INSULATOR SUBSTRATES USING APPLIED ELECTROSTATIC DISCHARGE

(75) Inventors: Robert J. Finch, Essex Junction, VT (US); George A. May, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 12/968,864

(22) Filed: Dec. 15, 2010

(65) Prior Publication Data

US 2012/0153962 A1 Jun. 21, 2012

(51) Int. Cl.
*G01N 27/60* (2006.01)

(52) U.S. Cl.
USPC .......................................... 324/456; 324/452

(58) Field of Classification Search
USPC ................................................ 324/456, 452
See application file for complete search history.

(56) References Cited

U.S. PATENT DOCUMENTS

| 4,636,724 A * | 1/1987 | Fukuda et al. ................. 324/527 |
| 4,823,088 A * | 4/1989 | Fukuda ......................... 324/456 |
| 5,650,336 A | 7/1997 | Eriguchi et al. |
| 5,793,212 A | 8/1998 | Om |
| 5,818,235 A | 10/1998 | Simonov et al. |
| 6,037,797 A | 3/2000 | Lagowski et al. |
| 6,504,393 B1 | 1/2003 | Lo et al. |
| 6,538,462 B1 | 3/2003 | Lagowski et al. |
| 6,570,388 B2 | 5/2003 | Lee et al. |
| 6,757,147 B1 * | 6/2004 | Tong et al. .................... 361/111 |
| 7,560,948 B2 * | 7/2009 | Grund ...................... 324/762.01 |
| 2008/0020488 A1 * | 1/2008 | Clevenger et al. ................ 438/3 |
| 2009/0250521 A1 * | 10/2009 | Fujita et al. ................... 235/488 |

* cited by examiner

*Primary Examiner* — Jeff Natalini
(74) *Attorney, Agent, or Firm* — Cantor Colburn LLP; Michael LeStrange

(57) ABSTRACT

A method of implementing electrostatic discharge (ESD) testing of an integrated circuit includes applying an ESD event to an exposed backside of a substrate of the integrated circuit, wherein the backside of the substrate is electrically isolated from circuit structures formed at a front-end-of-line (FEOL) region of the integrated circuit. The operation of the circuit structures is tested to determine whether the ESD event has caused damage to one or more of the circuit structures as a result of a breakdown in the electrical isolation between the circuit structures and the backside of the substrate.

16 Claims, 5 Drawing Sheets

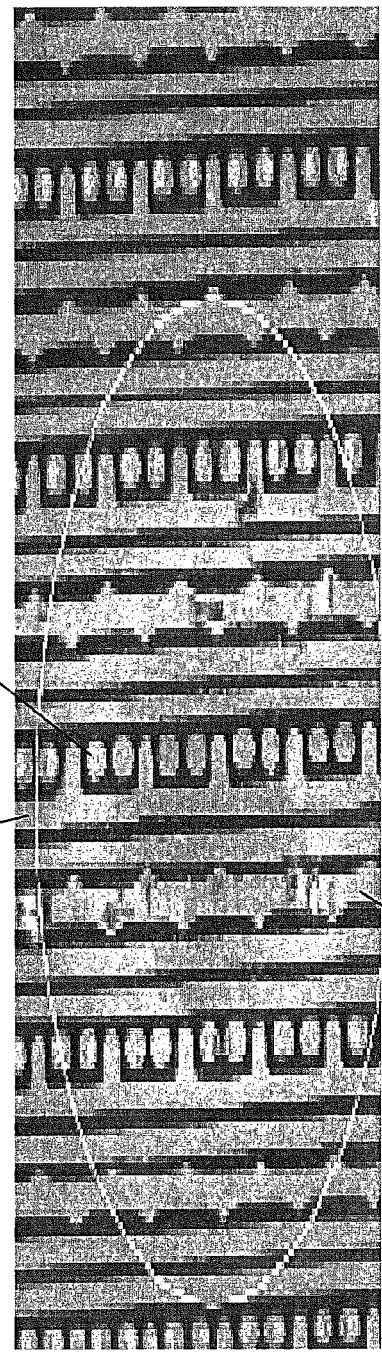
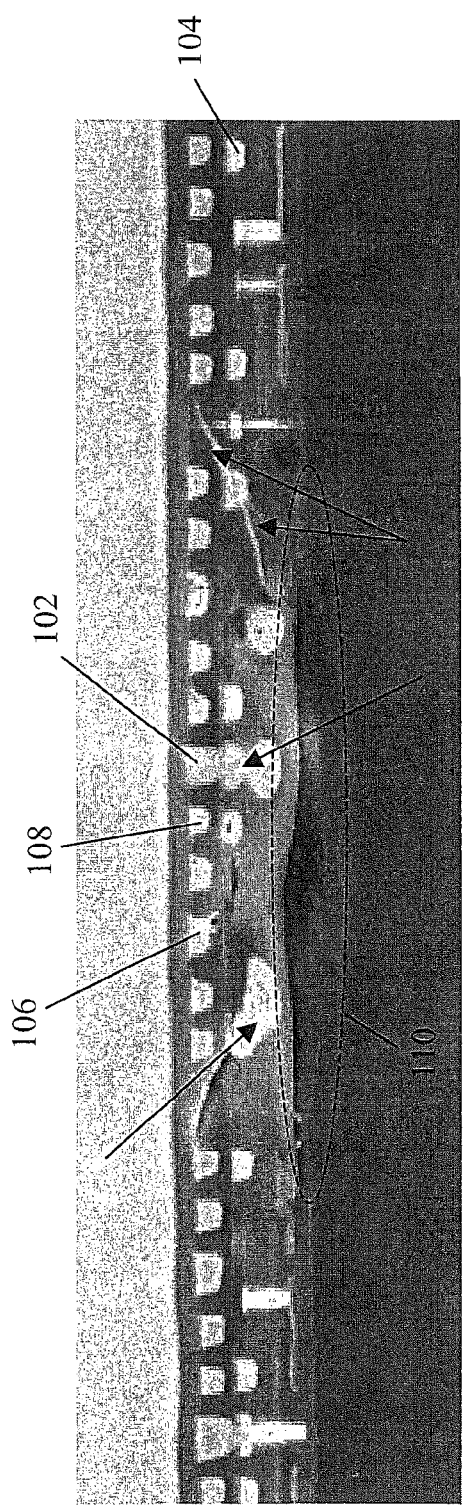
Figure 1
Figure 2

STRESS TESTING OF SILICON-ON-INSULATOR SUBSTRATES USING APPLIED ELECTROSTATIC DISCHARGE

BACKGROUND

The present invention relates generally to the protection of integrated circuits against electrostatic discharge (ESD) voltage events and, more particularly, to methods of stress testing of silicon-on-insulator (SOI) substrates using applied electrostatic discharge.

The progression of integrated circuit technology has led to the scaling of transistors to enable faster transistors operating at lower supply voltages. In complementary metal oxide semiconductor (CMOS) applications, the faster transistors require the use of very thin gate oxides and shorter channel lengths in order to obtain higher drive currents. The gate oxide thickness, for instance, has decreased from approximately 5.0 nanometers (nm) in 0.25 micron (μm) technology to approximately 1.5 nm in 90 nm technology, and is expected to decrease even further in future technologies. The thinner gate oxides are more susceptible to failure under random ESD voltages due to their smaller breakdown voltages.

The problem of ESD voltage events occurring on input/output (I/O) pins of an integrated circuit has been addressed in many ways. Most common is the use of an ESD protection device connected to the input/output pad of an integrated circuit to safely discharge ESD currents to ground before they can damage any of the connected circuitry. ESD events may be generally characterized by a human body model (HBM), a charged device model (CDM), or a machine model (MM). Different ESD models correspond to different current pulse waveforms and different peak currents.

It is important to manufacturers of electronic equipment to understand the susceptibility of such equipment to damage from electrostatic discharge. ESD testing typically involves simulating a human finger approaching an electronic device under test (DUT). An ESD probe is manually displaced toward a DUT which has been placed on a metal table, connected to ground. The results of ESD testing can be of value to manufacturers in improving such products so that they are less susceptible to damage.

SUMMARY

In one aspect, a method of implementing electrostatic discharge (ESD) testing of an integrated circuit includes applying an ESD event to an exposed backside of a substrate of the integrated circuit, wherein the backside of the substrate is electrically isolated from circuit structures formed at a front-end-of-line (FEOL) region of the integrated circuit; and testing operation of the circuit structures to determine whether the ESD event has caused damage to one or more of the circuit structures as a result of a breakdown in the electrical isolation between the circuit structures and the backside of the substrate.

In another aspect, a method of implementing electrostatic discharge (ESD) testing of an integrated circuit includes applying one or more first ESD events to external package pins of the integrated circuit, and determining whether one or more input/output (I/O) circuits of the integrated circuit are damaged as a result of the one or more first ESD events; applying a second ESD event to an exposed backside of a substrate of the integrated circuit, wherein the backside of the substrate is electrically isolated from circuit structures formed at a front-end-of-line (FEOL) region of the integrated circuit; and testing operation of the circuit structures to determine whether the second ESD event has caused damage to one or more of the circuit structures as a result of a breakdown in the electrical isolation between the circuit structures and the backside of the substrate.

In another aspect, a method of developing technology qualification for integrated circuits using electrostatic discharge (ESD) testing includes applying an ESD event to an exposed backside of a substrate of a sample integrated circuit, wherein the backside of the substrate is electrically isolated from circuit structures formed at a front-end-of-line (FEOL) region of the integrated circuit; testing the integrated circuit to determine whether the ESD event has caused changes in physical and electrical characteristics of the integrated circuit as a result of a breakdown in the electrical isolation between the circuit structures and the backside of the substrate; and defining manufacturing process specifications for the integrated circuit based on the results of the testing.

BRIEF DESCRIPTION OF THE SEVERAL VIEWS OF THE DRAWINGS

Referring to the exemplary drawings wherein like elements are numbered alike in the several Figures:

FIG. 1 is a top planar SEM photograph illustrating an integrated circuit device subjected to FEOL damage due to an ESD event applied to the backside of the bulk substrate;

FIG. 2 is a SEM photograph illustrating a Focused Ion Beam (FIB) cross sectional view of the integrated circuit device of FIG. 1;

DETAILED DESCRIPTION

Disclosed herein are methods of stress testing of silicon-on-insulator (SOI) substrates using applied electrostatic discharge. Previously, it was understood in the art that ESD events, typically occurring on I/O pins of an integrated circuit (IC), might result in damage to the I/O circuits of the IC device. However, it was recently discovered that damage to active device area structures (i.e., front-end-of-line (FEOL) structures) during IC card fabrication resulted from ESD events occurring on the exposed backside of the bulk portion of the SOI substrate. Such a discharge, in turn, stresses the electrical isolation of the buried oxide (BOX) layer and presents a path to ground. This discharge path was due to the formation of one or more defects that decreased the physical isolation of the active FEOL circuits formed in the thin, SOI layer and the bulk silicon substrate. Due to the relatively small physical dimensions of the defects, the resulting current density may be very large, which in turn may result in significant physical damage to the FEOL structures.

Referring initially to FIGS. 1 and 2, there is shown, respectively, SEM photographs illustrating top and cross sectional views of an integrated circuit device 100 subjected to FEOL damage due to an ESD event applied to the back side of the bulk substrate. More specifically, the IC device 100 is a static random access memory (SRAM) device that includes, in the lower wiring levels thereof, word lines 102, bit lines 104, voltage supply lines 106 and ground lines 108.

FIG. 1 shows that the ESD event causes distortion of some of the metal lines, as reflected by the wider/darker images in comparison to the undamaged, brighter structures. As will be noted from the figures, particularly in the case of FIG. 2, the ESD event has caused melting and distortion of various metal lines, as indicated by the arrows in FIG. 2. In addition, the dashed region 110 in FIG. 2 illustrates a region of thermal damage of the BOX oxide and silicon substrate.

Figure 3:
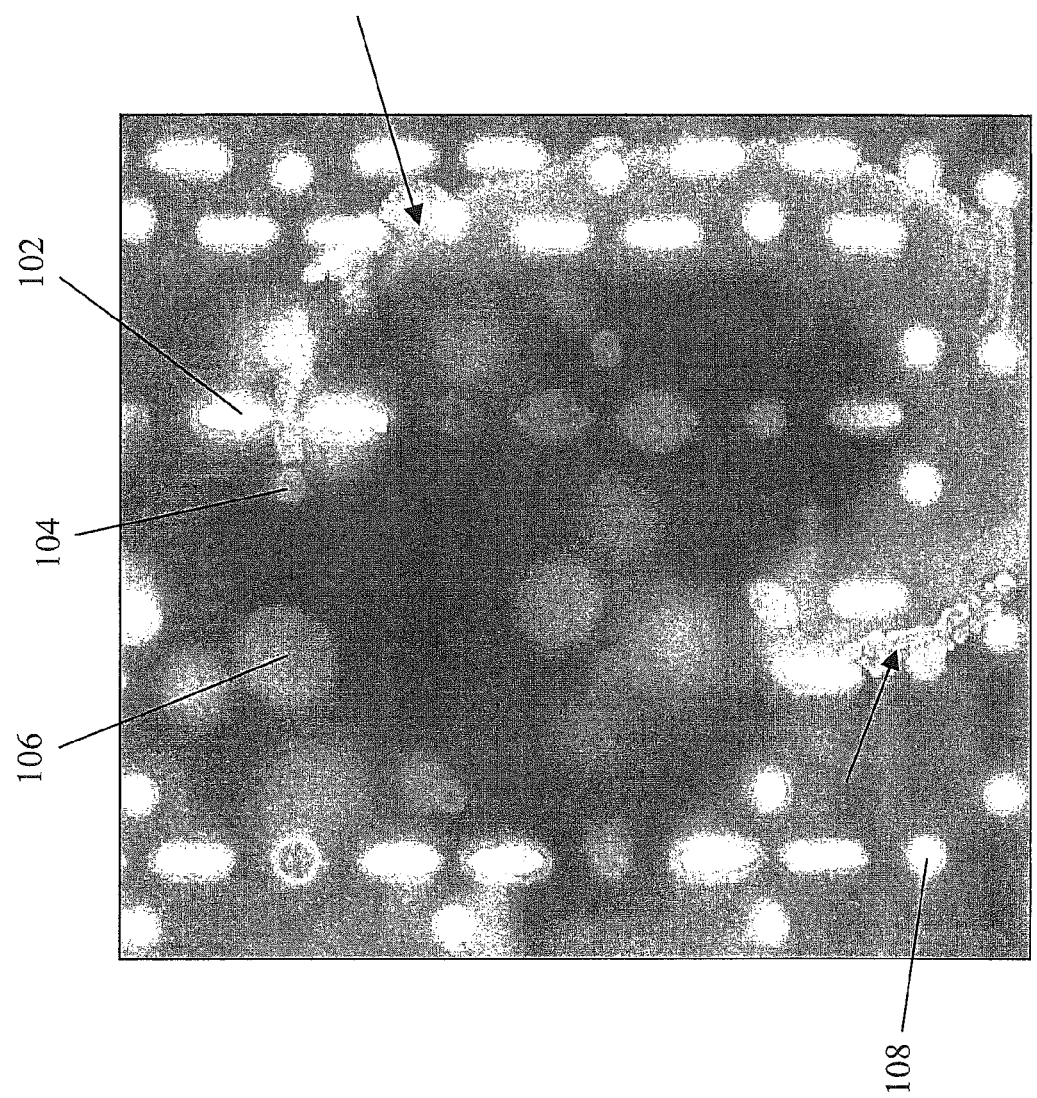
FIG. 3 is a top planar SEM photograph of FIG. 1, with back end of line metal removed, illustrating ESD damage to the integrated circuit device as a result of ESD applied to the backside of the bulk substrate.

FIG. 3 is another SEM image of an SRAM layout, which also depicts word lines 102, bit lines 104, voltage supply lines 106 and ground lines 108. Again, the arrows depict various regions of damage in FIG. 3.

Figure 4:
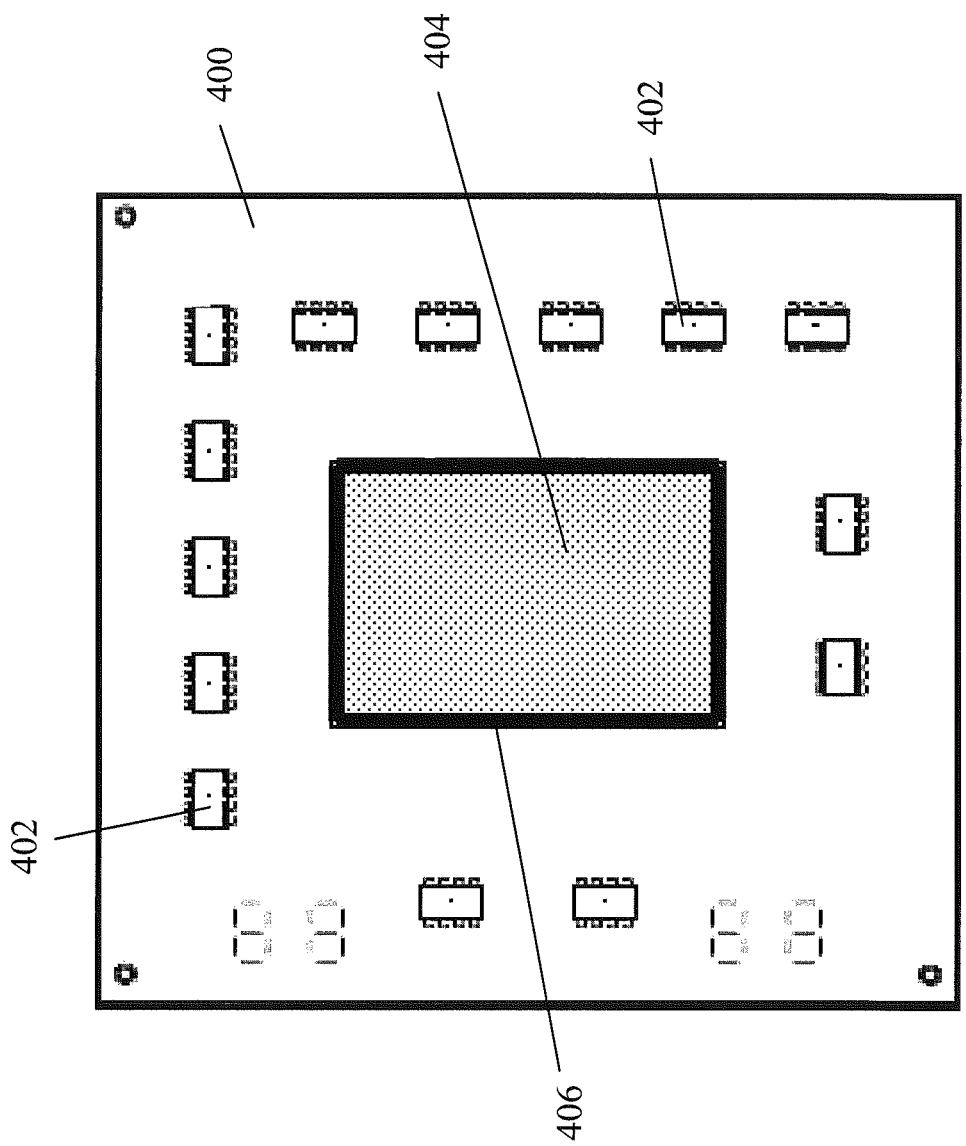
FIG. 4 is a schematic diagram of a circuit board having a plurality of integrated circuit chips attached thereto, one of which has a backside susceptible to an ESD event.

Referring now to FIG. 4, there is shown a schematic diagram of a circuit board 400 having a plurality of integrated circuit chips 402 attached thereto. A large IC chip 404 mounted at the center of the board 400 has its backside (i.e., a bulk silicon layer of an SOI substrate) exposed during manufacture. A guard ring 406 (also known as a ground ring in the art) surrounds the large IC chip 404. The buried oxide (BOX) layer of the chip 404 isolates the FEOL structures formed on the thin SOI layer from the bulk silicon substrate, as is known in SOI technologies. The silicon substrate is connected to ground through the guard ring 406. As the guard ring is a perimeter structure, any charge introduced into the silicon substrate would be required to flow to the perimeter of the chip to reach ground. In bulk technologies, substrate contacts are uniformly placed so that any induced charge has a distributed path to ground. This limits the current density and the potential for ESD induced physical damage.

However, as indicated above, when the exposed back side of the SOI chip 404 is subjected to an ESD event, any defects with respect to the vertical isolation between the FEOL and the back side of the chip can result in electrical breakdown of the buried oxide, and in turn damage the charge sensitive FEOL structures. Previously, no known methodology existed for ESD testing of SOI substrates for determining weaknesses in electrical isolation of FEOL from the bulk substrate by the SOI layer.

Accordingly, the embodiments herein introduce a methodology to identify these defects through the application of a controlled ESD event to the silicon substrate of SOI chips, with all pins held at ground potential. The ESD applied voltage would be increased to a level determined by the technology involved. Any failure prior to that level would be regarded as a potential liability either by design layout or process. In addition to manufacturing testing, the present approach may also become part of the ESD qualification for future SOI processes (i.e., used for technology development).

Figure 5:
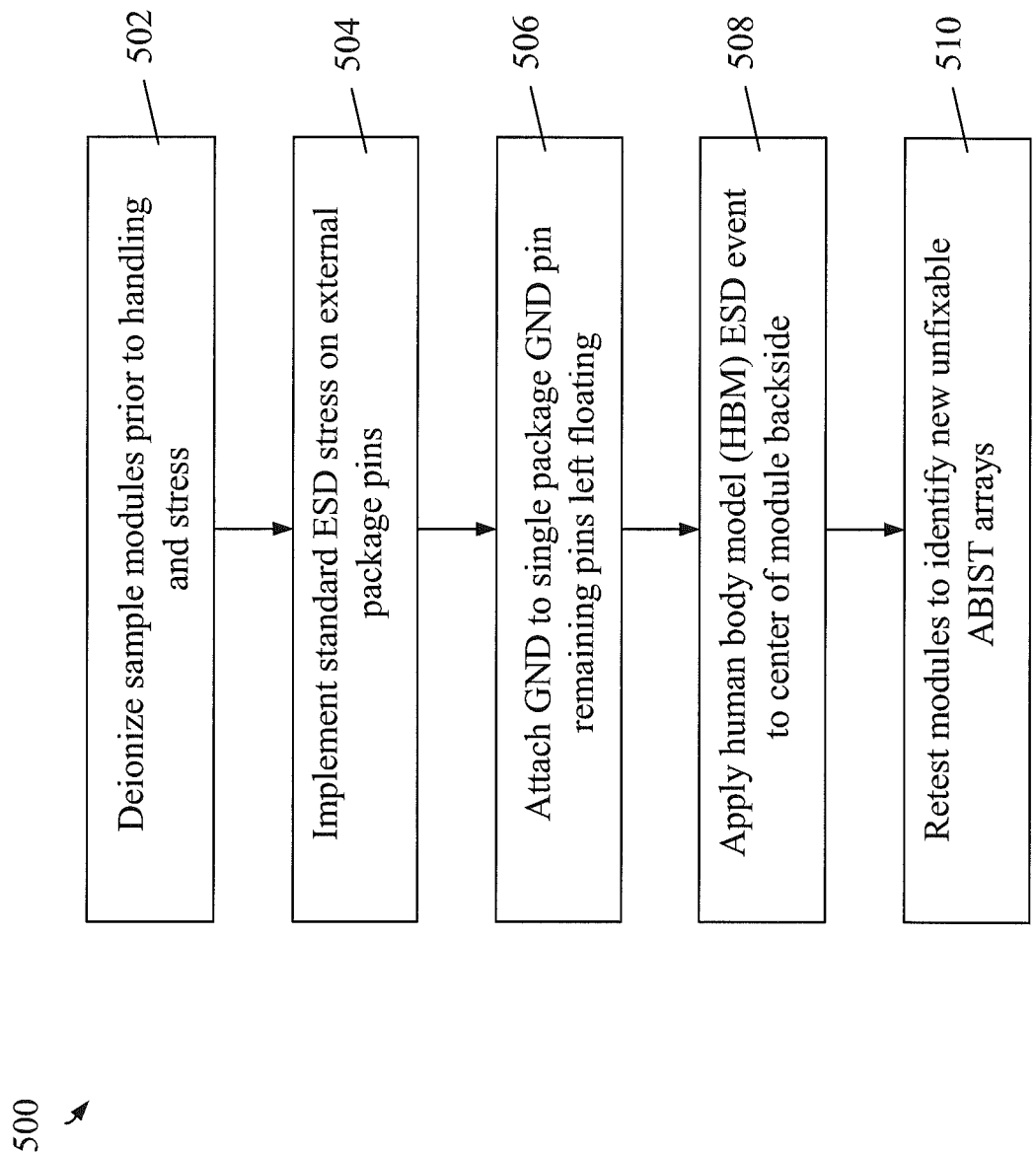
FIG. 5 is a flow diagram illustrating a method of implementing ESD testing of integrated circuits, in accordance with an embodiment of the invention.

Referring to FIG. 5, there is shown a flow diagram illustrating a method 500 of implementing ESD testing of integrated circuits, in accordance with an embodiment of the invention. As shown in block 502, integrated circuit modules to be tested are initially deionized prior to handling and stress testing. Then, in block 504, standard ESD testing is applied to the external package pins. As indicated above, this may include, for example, application of a human body model (HBM), a charged device model (CDM), or a machine model (MM) ESD event to the I/O pins to determine whether any damage to the I/O circuitry results.

In conventional ESD testing, the process would end at this point. However, as shown in block 506, the method continues with grounding a single package ground pin while keeping remaining pins of the package at a floating potential. Then, in block 508, an HBM ESD event is applied to the center of the backside of the module (e.g., to the exposed bulk portion of the SOI substrate 404 shown in FIG. 4). The magnitude of the HBM discharge may be set to a first value (e.g., −/+1000V), and then subsequently increased (e.g., in increments of 1000V) for additional discharges. After each discharge, the module is retested to identify any new unfixable ABIST (automatic built-in self test) circuitry as shown in block 510.

Whereas some SOI modules may pass a standard HBM application to I/O pins at a voltage of, for example 8000V, it is possible that fails may be observed when an HBM discharge of, for example, 4000V or less is applied to the backside of an SOI substrate. Such fails may be the result of, for example, over etching of the SOI layer during FEOL processing so as to penetrate into the buried oxide layer, which in turn results in the buried oxide breaking down and allowing high current into the FEOL circuits. Thus, the above described approach is a useful addition to ESD qualification processes for future SOI technologies.

Figure 6:
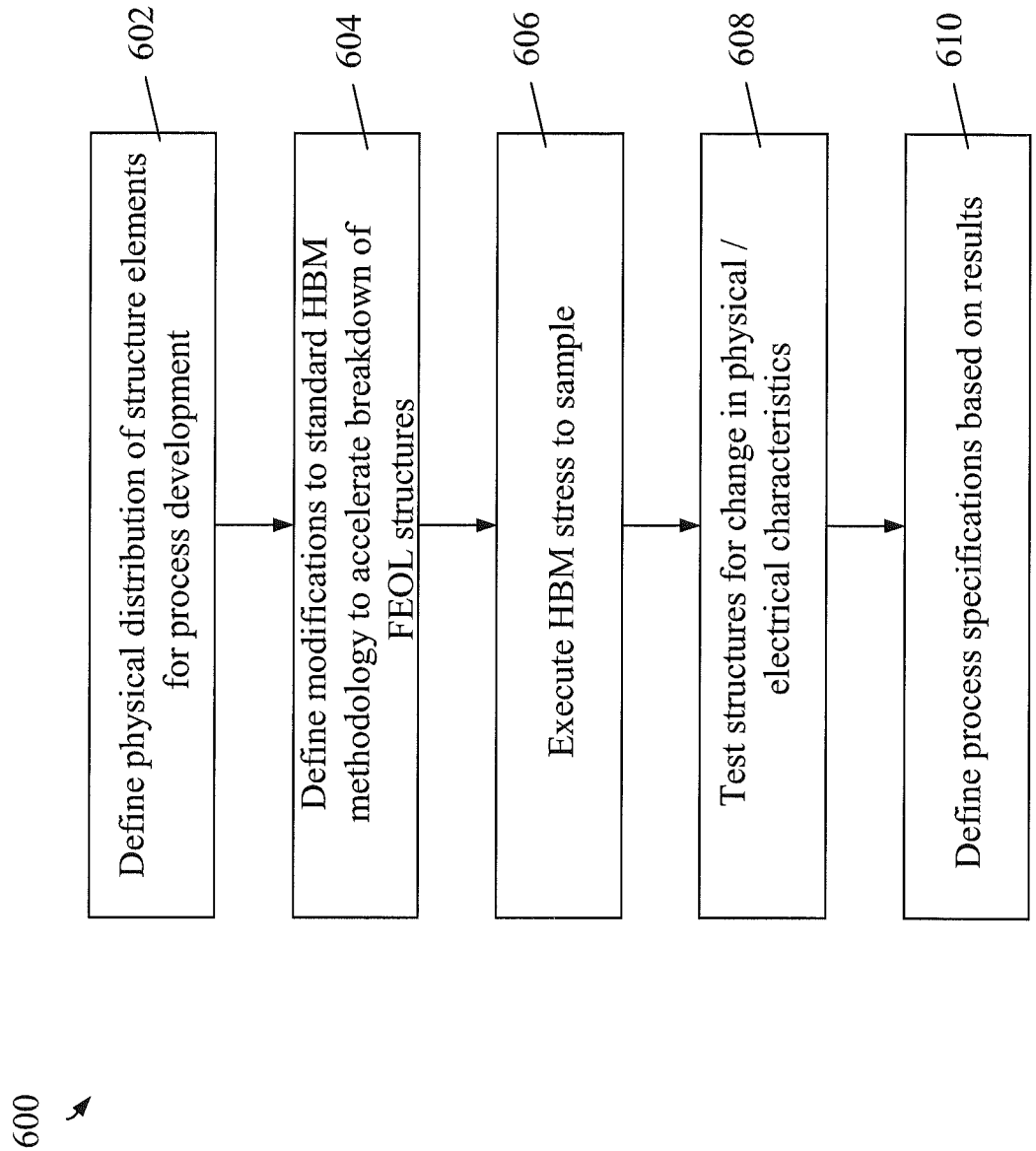
FIG. 6 is a flow diagram illustrating a method of developing technology qualification for integrated circuits using ESD testing, in accordance with a further embodiment of the invention.

In addition to integrating SOI substrate ESD testing protocols into standard ESD testing during semiconductor manufacturing, such backside testing can also be used in the technology development phase of integrated circuit design. In this regard, FIG. 6 is a flow diagram illustrating a method 600 of developing technology qualification for integrated circuits using ESD testing, in accordance with a further embodiment of the invention. As shown in block 602, the process begins by defining a physical distribution of structure elements for process development. In order to be competitive in performance, Technology Development is required to push the physical characteristics of the device structures. In doing so, the process development must guarantee the ability to manufacture such structures. Then, in block 304, modifications to standard HBM methodologies are defined in order to accelerate the breakdown of FEOL structures due to breakdown of the buried oxide layer in SOI devices. Once the HBM methodologies are defined, sample circuits are subjected to HBM discharges applied to the SOI substrates, as shown in block 606.

Following the HBM application, the circuit structures are tested for changes in physical and electrical characteristics, as shown in block 608. With this information, process specifications can then be defined based on the results, as shown in block 610. Such process specifications may include, for example, minimum buried oxide layer thicknesses, SOI layer thicknesses, etching times during fabrication of the FEOL structures, etc.

Through either or both of manufacturing testing or technology development applications of HBM ESD backside stressing of circuit substrates, it is anticipated that advantages include both improvements in yield, as well as shipped product quality level (SPQL).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing electrostatic discharge (ESD) testing of an integrated circuit, the method comprising:
applying an ESD event to an exposed backside of a substrate of the integrated circuit, wherein the backside of the substrate is a bulk portion of a silicon-on-insulator substrate, and is electrically isolated from circuit structures formed at a front-end-of-line (FEOL) region of the integrated circuit; and
testing operation of the circuit structures to determine whether the ESD event has caused damage to one or more of the circuit structures as a result of a breakdown in the electrical isolation between the circuit structures and the backside of the substrate.

2. The method of claim 1, wherein the ESD event comprises a human body model (HBM) ESD event.

3. The method of claim 1, wherein the substrate comprises a bulk semiconductor layer of a silicon-on-insulator (SOI) substrate having a buried oxide (BOX) layer between the bulk semiconductor layer and a thin SOI layer on which the FEOL structures are formed.

4. The method of claim 1, further comprising grounding a single package ground pin of the integrated circuit and keeping remaining pins of the integrated circuit at a floating potential in preparation of the ESD event.

5. The method of claim 1, further comprising repeating applying an ESD event to the exposed backside of the substrate at incrementally higher ESD voltages and testing operation of the circuit structures to determine whether the repeated ESD events have caused damage to one or more of the circuit structures as a result of a breakdown in the electrical isolation between the circuit structures and the backside of the substrate.

6. A method of implementing electrostatic discharge (ESD) testing of an integrated circuit, the method comprising:
applying one or more first ESD events to external package pins of the integrated circuit, and determining whether one or more input/output (I/O) circuits of the integrated circuit are damaged as a result of the one or more first ESD events;
applying a second ESD event to an exposed backside of a substrate of the integrated circuit, wherein the backside of the substrate is a bulk portion of a silicon-on-insulator substrate, and is electrically isolated from circuit structures formed at a front-end-of-line (FEOL) region of the integrated circuit; and
testing operation of the circuit structures to determine whether the second ESD event has caused damage to one or more of the circuit structures as a result of a breakdown in the electrical isolation between the circuit structures and the backside of the substrate.

7. The method of claim 6, wherein the second ESD event comprises a human body model (HBM) ESD event.

8. The method of claim 7, wherein the substrate comprises a bulk semiconductor layer of a silicon-on-insulator (SOI) substrate having a buried oxide (BOX) layer between the bulk semiconductor layer and a thin SOI layer on which the FEOL structures are formed.

9. The method of claim 8, further comprising grounding a single package ground pin of the integrated circuit and keeping remaining pins of the integrated circuit at a floating potential in preparation of the ESD event.

10. The method of claim 9, further comprising repeating applying a second ESD event to the exposed backside of the substrate at incrementally higher ESD voltages and testing operation of the circuit structures to determine whether the repeated second ESD events have caused damage to one or more of the circuit structures as a result of a breakdown in the electrical isolation between the circuit structures and the backside of the substrate.

11. A method of developing technology qualification for integrated circuits using electrostatic discharge (ESD) testing, the method comprising:
applying an ESD event to an exposed backside of a substrate of a sample integrated circuit, wherein the backside of the substrate is a bulk portion of a silicon-on-insulator substrate, and is electrically isolated from circuit structures formed at a front-end-of-line (FEOL) region of the integrated circuit; and
testing the integrated circuit to determine whether the ESD event has caused changes in physical and electrical characteristics of the integrated circuit as a result of a breakdown in the electrical isolation between the circuit structures and the backside of the substrate; and
defining manufacturing process specifications for the integrated circuit based on the results of the testing.

12. The method of claim 11, wherein the ESD event comprises a human body model (HBM) ESD event.

13. The method of claim 12, further comprising defining a physical distribution of the circuit structures for process development.

14. The method of claim 13, further comprising grounding a single package ground pin of the integrated circuit and keeping remaining pins of the integrated circuit at a floating potential in preparation of the ESD event.

15. The method of claim 12, further comprising defining modifications to an existing HBM methodology to accelerate breakdown of the circuit structures.

16. The method of claim 12, wherein the substrate comprises a bulk semiconductor layer of a silicon-on-insulator (SOI) substrate having a buried oxide (BOX) layer between the bulk semiconductor layer and a thin SOI layer on which the FEOL structures are formed.

* * * * *